(12) United States Patent
Lazar

(10) Patent No.: US 9,075,118 B2
(45) Date of Patent: Jul. 7, 2015

(54) MAGNETIC RESONANCE ANTENNA ARRANGEMENT AND METHOD FOR ACQUIRING MAGNETIC RESONANCE SIGNALS USING THE MAGNETIC RESONANCE ANTENNA ARRANGEMENT

(75) Inventor: Razvan Lazar, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 298 days.

(21) Appl. No.: 13/197,636

(22) Filed: Aug. 3, 2011

(65) Prior Publication Data

US 2012/0200294 A1 Aug. 9, 2012

(30) Foreign Application Priority Data

Aug. 4, 2010 (DE) .......................... 10 2010 033 330

(51) Int. Cl.
*G01R 33/36* (2006.01)
*G01R 33/34* (2006.01)
(52) U.S. Cl.
CPC ...... *G01R 33/3664* (2013.01); *G01R 33/34046* (2013.01); *G01R 33/34076* (2013.01)
(58) Field of Classification Search
CPC ..................... G01R 33/3664; G01R 33/34046; G01R 33/34076
See application file for complete search history.

(56) References Cited

U.S. PATENT DOCUMENTS

| | | | | |
|---|---|---|---|---|
| 6,157,280 A * | 12/2000 | Arz et al. | ....................... | 335/299 |
| 6,437,568 B1 * | 8/2002 | Edelstein et al. | ............. | 324/318 |
| 6,545,473 B1 * | 4/2003 | Gebhardt et al. | ............. | 324/318 |
| 6,624,633 B1 * | 9/2003 | Zou et al. | ....................... | 324/318 |
| 6,897,658 B2 * | 5/2005 | Belt et al. | ....................... | 324/322 |
| 6,969,992 B2 * | 11/2005 | Vaughan et al. | ............. | 324/318 |
| 7,012,430 B2 * | 3/2006 | Misic | ............................ | 324/318 |
| 7,026,818 B2 * | 4/2006 | Machida et al. | ............. | 324/322 |
| 7,253,621 B2 * | 8/2007 | Steen et al. | ................... | 324/318 |
| 7,633,293 B2 * | 12/2009 | Olson et al. | ................... | 324/318 |
| 7,671,593 B2 * | 3/2010 | Goldhaber et al. | ........... | 324/318 |
| 7,728,591 B2 * | 6/2010 | Weizenecker et al. | ....... | 324/318 |
| 7,782,057 B2 * | 8/2010 | Okamoto et al. | ............. | 324/318 |
| 7,965,083 B2 * | 6/2011 | Okamoto et al. | ............. | 324/318 |
| 8,129,992 B2 * | 3/2012 | Cork et al. | ..................... | 324/318 |
| 8,198,895 B2 * | 6/2012 | Iannotti et al. | ................ | 324/318 |

(Continued)

FOREIGN PATENT DOCUMENTS

| | | |
|---|---|---|
| CN | 1717591 | 1/2006 |
| CN | 101226230 | 7/2008 |
| DE | 10 2006 055 136 A1 | 5/2008 |

OTHER PUBLICATIONS

German Office Action dated Jun. 9, 2011 for corresponding German Patent Application No. DE 10 2010 033 330.1 with English translation.

(Continued)

*Primary Examiner* — Dixomara Vargas
(74) *Attorney, Agent, or Firm* — Lempia Summerfield Katz LLC

(57) ABSTRACT

A magnetic resonance antenna arrangement having a plurality of antenna elements disposed around a measurement chamber and a plurality of switching elements is provided. The antenna elements and the switching elements are disposed and interconnected such that in a first switching configuration of the switching elements, the antenna elements form a first antenna architecture, and in a second switching configuration of the switching elements, the antenna elements form a second antenna architecture.

14 Claims, 3 Drawing Sheets

(56) References Cited

U.S. PATENT DOCUMENTS

| | | | |
|---|---|---|---|
| 8,427,158 B2 * | 4/2013 | Huish et al. | 324/318 |
| 8,497,682 B2 * | 7/2013 | Huish et al. | 324/318 |
| 8,587,311 B2 * | 11/2013 | Nnewihe et al. | 324/318 |
| 8,742,760 B2 * | 6/2014 | Matschl et al. | 324/318 |
| 8,766,632 B2 * | 7/2014 | Biber et al. | 324/307 |
| 2006/0033497 A1 | 2/2006 | Chmielewski et al. | |
| 2008/0129296 A1 | 6/2008 | Fischer et al. | |

OTHER PUBLICATIONS

Chinese Office Action for CN Application No. 201110221998.4, mailed Apr. 25, 2014.

\* cited by examiner

MAGNETIC RESONANCE ANTENNA ARRANGEMENT AND METHOD FOR ACQUIRING MAGNETIC RESONANCE SIGNALS USING THE MAGNETIC RESONANCE ANTENNA ARRANGEMENT

This application claims the benefit of DE 10 2010 033 330.1, filed on Aug. 4, 2010.

BACKGROUND

The present embodiments relate to a magnetic resonance arrangement having a plurality of antenna elements disposed around a measurement chamber.

In a magnetic resonance device, a body to be examined may be exposed to a relatively high basic magnetic field (e.g., of 3 or 7 Tesla) with the aid of a basic magnetic field system. A magnetic field gradient is additionally applied with the aid of a gradient system. Radio-frequency magnetic resonance excitation signals (RF signals) are transmitted via a radio-frequency transmission system using suitable antennas, the aim being to tilt the nuclear spins of specific atoms resonantly excited by the radio-frequency field through a defined flip angle with respect to the magnetic field lines of the basic magnetic field. The radio-frequency excitation or the resulting flip angle distribution is also referred to as nuclear magnetization. During the relaxation of the nuclear spins, radio-frequency signals (e.g., magnetic resonance signals) are emitted, are received using suitable receive antennas, and are processed further. The desired image data may be reconstructed from raw data acquired in this way. The radio-frequency signals for producing the nuclear spin magnetization may be transmitted using a "whole-body coil" or a "bodycoil". A typical structure for this is a cage antenna (e.g., a birdcage antenna) consisting of a plurality of transmit rods that are disposed running parallel to the longitudinal axis around a patient chamber of a tomograph apparatus, in which a patient is positioned during the examination. At a front side, the antenna rods are connected to one another in the shape of a ring.

Individual antenna rods may consist of conductor tracks equipped with reactance components (e.g., capacitive elements) having specific predetermined values. The ring segments interconnecting the antenna rods are structured as conductor tracks having specific reactance components. Apart from a frontal annular connection, it is also possible in the case of relatively long cage antennas to connect the antenna rods in addition in a ring shape at one or more points in a central region.

Local coils that are directly attached to the body of the patient may be used for receiving the magnetic resonance signals. The local coils may include a group of conductor loops (e.g., an antenna array), the antenna conductor loops being operable individually. The antenna array may form a relatively large surface antenna on the body of the examination subject or patient. The antenna elements may be constructed so as to be particularly sensitive and capable of also receiving weak signals that are amplified and may be used as raw data. An advantage of such an antenna array having a plurality of individually operable conductor loops is that within the scope of parallel imaging methods, the image acquisition process is speeded up considerably, and as a result, the patient's exposure to radiation may be reduced. Many patients find it unpleasant having relatively large local coil arrays attached to their body. This may be true of patients of a claustrophobic disposition who already feel confined inside the patient tunnel.

The antenna architecture known as a "remote body array" (also referred to in the following as RBA for short) may be a suitable solution for implementing a magnetic resonance device having a minimum requirement for local coils. An RBA consists of an array of individual antenna conductor loops disposed at a distance from the patient within the measurement chamber. Conventionally, the RBA is constructed in the measurement chamber inside the bodycoil. An attempt is made to position the RBA as close as possible to walls of the measurement chamber so that as much free space as possible is available to the patient. The RBA disposed within the measurement chamber also restricts the free space for the patient.

SUMMARY AND DESCRIPTION

The present embodiments may obviate one or more of the drawbacks or limitations in the related art. For example, a magnetic resonance antenna arrangement for a magnetic resonance device that allows flexible deployment of the magnetic resonance antenna arrangement both during the transmission of magnetic resonance excitation signals and during the reception of magnetic resonance signals may be provided.

One embodiment of a magnetic resonance antenna arrangement has a plurality of antenna elements disposed around a measurement chamber and a plurality of switching elements. The antenna elements are individual elements of an antenna that are interconnected in a suitable manner in order to form the antenna (e.g., conductor tracks, conductor track configurations, reactance elements such as capacitive and/or inductive components that may be connected to the conductor tracks or disposed in the conductor tracks or capacitors or inductors formed by the antenna elements). Depending on a switching state, the switching elements serve to connect two or more antenna elements to one another electrically or to break the electrical connection. In this arrangement, the antenna elements and the switching elements are disposed and interconnected such that in a first switching configuration or switching situation of the switching elements, the antenna elements form a first antenna architecture, and in a second switching configuration of the switching elements, the antenna elements form a second antenna architecture.

Using the magnetic resonance antenna arrangement according to one embodiment, it is possible, by suitable activation of the switching elements, to switch the entire magnetic resonance antenna arrangement back and forth between different antenna architectures. The term "antenna architecture" may be a specific type of antenna (e.g., a birdcage antenna, a saddle coil antenna, an RBA) but not different scalings of the same antenna type (e.g., a birdcage antenna that is lengthened by additional antenna elements being attached or shortened by antenna elements being decoupled, while the architecture remains identical).

A magnetic resonance device according to the present embodiments is equipped with a corresponding antenna arrangement.

In one embodiment of a method for acquiring magnetic resonance signals using a magnetic resonance device, the antenna elements are interconnected by the switching elements in order to transmit magnetic resonance excitation signals into the measurement chamber or, for example, into the examination subject such that the antenna elements form a first antenna architecture. In order to receive magnetic resonance signals from the examination subject, the antenna elements are interconnected by the switching elements such that the antenna elements form a second antenna architecture.

The present embodiments enable one magnetic resonance antenna arrangement to be used in totally different ways and also different transmit and/or receive characteristics to be used by interconnecting the individual antenna elements to form different antenna architectures. Magnetic resonance excitation signals and receive magnetic resonance signals may be transmitted using different methods that are dependent on the antenna architecture. Since at least some of the same antenna elements are used for the different antenna architectures, and the different antenna architectures are effectively integrated into one another, only a small installation space is used.

The claims of one category may also be developed analogously to the claims of one of the other categories.

At least one of the antenna architectures (e.g., the first antenna architecture) may include a birdcage antenna (e.g., the antenna elements are interconnected to form a birdcage antenna in at least one of the switching configurations of the switching elements). At least one of the antenna architectures (e.g., the second antenna architecture) also includes an antenna array or an RBA having a plurality of individually operable antenna conductor loops. The antenna elements are interconnected to form the antenna array in at least one further switching configuration of the switching elements.

The antenna arrangement may be configured such that the antenna arrangement may also be switched between other antenna architectures (e.g., more than two different antenna architectures). Typical further antenna architectures may be, for example, saddle coil arrangements, different loop antennas with and without overlapping conductor structures, butterfly antennas, clover antennas, spiral antennas, V-shaped antennas, patch antennas (e.g., microstrip antennas) or a series of electric dipoles disposed around the patient chamber in order to enable the magnetic component and the electrical field strength of the receive signal to be used for imaging in the transmit and/or receive phase.

The antenna elements may include a reactance component. The reactance component (e.g., "reactance") is a component having a specific capacitive and/or inductive value. The reactances are used in the antenna in order to realize a specific electrical antenna structure having a defined operating frequency.

In one embodiment, at least one antenna element (e.g., more than one or all of the antenna elements) has at least one reactance component having an adjustable or switchable value. This enables the reactances within the antenna elements to be aligned to the antenna architecture. In a specific antenna architecture, the individual antenna elements may each have specific reactance values (e.g., capacitive values) for the desired function. The values of the reactances may also be adjusted to match the respective antenna architecture in common with the switching elements that couple the individual antenna elements to one another.

In one embodiment, a reactance component having an adjustable value includes a module consisting of capacitive and/or inductive components and at least one module switching element. Within the module, the capacitive and/or inductive components may be interconnected in different ways using the module switching elements as requirements dictate (e.g., according to the reactance values required in each case for the antenna architecture). Capacitive and/or inductive components may be bypassed or attached using a module switching element. Reactances may be switched over between different values.

Both the switching elements for interconnecting or disconnecting the antenna elements and the module switching elements may be radio-frequency-capable semiconductor switching elements. In one embodiment, diodes (e.g., PIN diodes) that are components used generally in antenna technology for radio-frequency switching tasks are employed for this purpose. Suitable transistors such as, for example, bipolar or field-effect transistors, or other electromechanical components such as relay-like components that may operate electrostatically, since these, in contrast to electromagnetically operating relays, do not affect the magnetic field in the magnetic resonance tomography apparatus or are not affected by the magnetic field of the magnetic resonance device, may be used.

The switching elements and/or the module switching elements may be connected to a control device (e.g., a central control device) in order to switch the switching elements and, where applicable, also the module switching elements between at least a first switching configuration and a second switching configuration. The central control device may have, for example, a control input, via which a configuration command is passed by the operator or by other units of the magnetic resonance device, as specified by a measurement protocol, for example. Based on the configuration command, the control device outputs corresponding switching commands to the individual switching elements or module switching elements.

The antenna elements may advantageously be disposed on a supporting tube surrounding the measurement chamber. For example, the antenna elements may take the form of conductor tracks that are mounted externally on the supporting tube. The reactances are disposed on the conductor tracks at appropriate points.

In one embodiment, the reactance components also include, for example in the form of modules, different capacitive and/or inductive components that are dimensioned for different radio-frequency power levels for the different antenna architectures. For example, one of the antenna architectures (e.g., a birdcage antenna) may be used for transmitting the magnetic resonance excitation signals. Such an antenna architecture is configured for relatively high power levels. If, for example, the other antenna architecture is an RBA that is essentially to be used for receiving the magnetic resonance signals, then it is advantageous if the associated components are not configured to deliver high performance, but are embodied with maximum sensitivity in order to reliably capture even the weakest signals. Accordingly the reactances or, more specifically, the capacitive and/or inductive components used therein may be designed with appropriate sensitivity for the second antenna architecture.

DETAILED DESCRIPTION OF THE DRAWINGS

Figure 1:
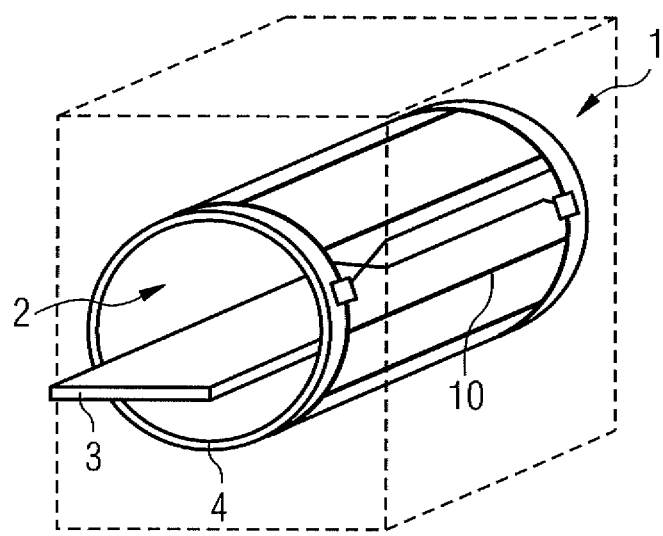
FIG. 1 shows one embodiment of a magnetic resonance device having a magnetic resonance antenna arrangement.

FIG. 1 shows a measurement chamber 2 (e.g., a patient tunnel) in a magnetic resonance device 1, the housing of which is only indicated schematically. The patient tunnel 2 may be a cylindrical supporting tube 4 made of fiber glass, for example. A couch 3 (e.g., a bed), on which a patient or another examination subject may be positioned for the purpose of acquiring a magnetic resonance image, is located in an interior of the cylindrical supporting tube 4. The couch 3 is movable in a motor-driven manner inside the measurement chamber 2 and may also be moved out of the measurement chamber 2 in order to relocate the examination subject.

Mounted on the outside of the supporting tube 4 is a magnetic resonance antenna arrangement 10. The magnetic resonance arrangement includes a plurality of individual conductor track sections. The plurality of individual conductor track sections have reactances (not shown in FIG. 1) at certain points and for this purpose, are interrupted, for example, using capacitors. Values of the reactances or the capacitances may be chosen such that a specific electrical structure of the antenna arrangement 10 is formed. Radio-frequency signals may be transmitted into the measurement chamber 2 with the aid of the antenna arrangement 10 in order to excite nuclear spins in an examination subject contained in the measurement chamber.

The magnetic resonance device 1 may also include a plurality of further components (e.g., a basic field magnet) in order to apply a basic magnetic field in the measurement chamber 2 and gradient coils in order to enable an arbitrary magnetic field gradient to be applied in all three spatial directions. Further components of the magnetic resonance device 1 may include: corresponding control devices in order to enable a basic field magnet and magnetic field gradients to be controlled; radio-frequency transmission devices for generating and amplifying radio-frequency pulses in order to transmit the radio-frequency pulses via the antenna arrangement 10; and receiving devices in order to receive, amplify and post-process magnetic resonance signals from the measurement chamber 2 or, more specifically, the examination subject via the antenna arrangement 10. In addition, the radio-frequency transmission devices and the receiving devices may also have terminals in order to allow the connection of external local coils that may be placed onto, under or against the examination subject and introduced with the examination subject into the measurement chamber 2 of the magnetic resonance device 1.

The present embodiments may be used not only with magnetic resonance devices that have a cylindrical patient tunnel, but also on magnetic resonance devices of different design (e.g., having a measurement chamber that is open on three sides). The antenna arrangement is adapted accordingly.

Figure 2:
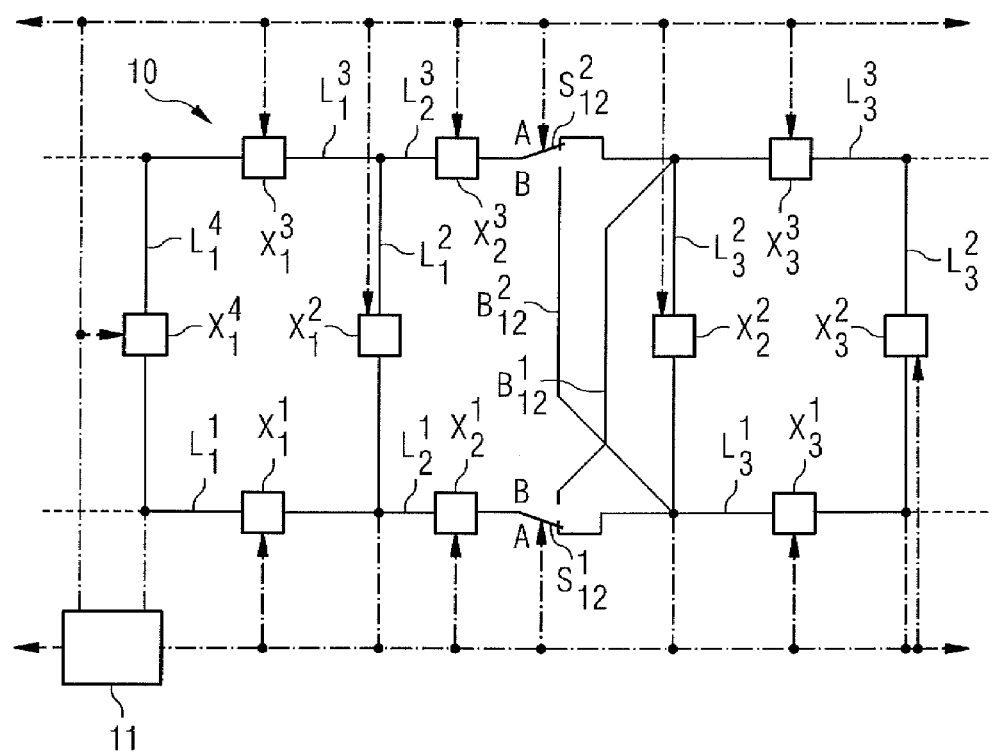
FIG. 2 shows a part of one embodiment of the magnetic resonance antenna arrangement of FIG. 1 in an unrolled representation.

FIG. 2 shows a schematic circuit diagram of a part of an unrolled antenna arrangement 10 from the exemplary embodiment according to FIG. 1.

The structure of the magnetic resonance antenna arrangement 10 according to FIGS. 1 and 2 is chosen such that individual antenna elements $L_1^1, L_1^2, L_1^3, L_1^4, L_2^1, L_2^2, L_2^3, L_3^1, L_3^2, L_3^3$ may be interconnected with the aid of switching elements $S_{12}^1, S_{12}^2$ such that the individual antenna elements form either a first antenna architecture $A_1$ corresponding to a birdcage antenna or a second antenna architecture $A_2$ corresponding to an antenna array having a plurality of individually operable antenna conductor loops. The precise modes of operation of the first antenna architecture and the second antenna architecture $A_1, A_2$ are explained below with reference to FIGS. 4 and 5.

As shown in FIG. 2, the magnetic resonance antenna arrangement 10 is a plurality of individual antenna elements $L_1^1, L_1^2, L_1^3, L_1^4, L_2^1, L_2^2, L_2^3, L_3^1, L_3^2, L_3^3$, each of which is formed by individual conductor track sections. Contained in each of the individual conductor track sections are reactances $X_1^1, X_1^2, X_1^3, X_1^4, X_2^1, X_2^2, X_2^3, X_3^1, X_3^2, X_3^3$ (e.g., capacitors) having a specific value. In FIG. 2, the reactances $X_1^1, X_1^2, X_1^3, X_1^4, X_2^1, X_2^2, X_2^3, X_3^1, X_3^2, X_3^3$ are represented as rectangular symbols (e.g., two-gate). The reactances may be switchable reactances $X_1^1, X_1^2, X_1^3, X_1^4, X_2^1, X_2^2, X_2^3, X_3^1, X_3^2, X_3^3$ (e.g., reactance components $X_1^1, X_1^2, X_1^3, X_1^4, X_2^1, X_2^2, X_2^3, X_3^1, X_3^2, X_3^3$ that may be switched between different reactance values using switching commands of a control device 11), as is explained below with reference to FIG. 4.

The antenna arrangement 10 also has a plurality of switching elements $S_{12}^1, S_{12}^2$ that, depending on switching state, connect or disconnect specific antenna elements $L_2^1, L_3^1, L_2^3, L_3^3$ to or from one another. The plurality of switching elements $S_{12}^1, S_{12}^2$ are RF-suitable PIN diodes. According to the switching state of the plurality of switching elements $S_{12}^1, S_{12}^2$, the antenna elements $L_1^1, L_1^2, L_1^3, L_1^4, L_2^1, L_2^2, L_2^3, L_3^1, L_3^2, L_3^3$ may be interconnected to form different antenna architectures.

In the exemplary embodiment shown in FIG. 2, antenna elements $L_1^4, L_1^2, L_2^2, L_3^2$ running vertically each form a longitudinal rod of a birdcage structure, and horizontally running antenna elements $L_1^3, L_2^3, L_3^3, L_1^1, L_2^1, L_3^1$ each form an end ring of the birdcage structure.

Switching element $S_{12}^1$ is disposed such that in the switching state shown in FIG. 2 (e.g., switch position A), the switching element $S_{12}^1$ interconnects antenna elements $L_2^1, L_3^1$ of a bottom end ring. In a different switch position (e.g., switch position B), the switching element $S_{12}^1$ disconnects the antenna elements $L_2^1, L_3^1$ from one another and instead connects middle antenna element $L_2^1$ of the bottom end ring crosswise to antenna element $L_3^3$ (e.g., right-hand antenna element $L3^3$) of top end ring shown on the extreme right in FIG. 2. A different switching element $S_{12}^2$ optionally provides that middle antenna element $L_2^3$ of the top end ring may be connected to the right-hand antenna element $L_3^3$ of the top end ring or to right-hand antenna element $L_3^1$ of the bottom end ring.

The switching elements $S_{12}^1, S_{12}^2$ are contained in every second antenna element of the end rings. In other words, the antenna elements (not shown) in the end rings adjacent to the antenna elements shown on the edge side in FIG. 2 are connected to corresponding switching elements. The switching elements $S_{12}^1, S_{12}^2$ are controlled using switching commands from the control device 11 in order to switch the switching elements $S_{12}^1, S_{12}^2$ in synchronism between switching states A and B.

Figure 3:
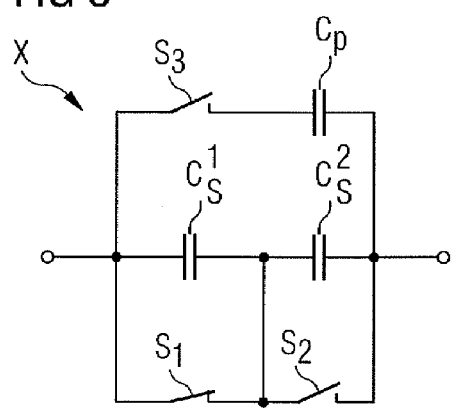
FIG. 3 shows a circuit diagram of one embodiment of a reactance component.

For the different antenna architectures, the individual antenna elements $L_1^1, L_1^2, L_1^3, L_1^4, L_2^1, L_2^2, L_2^3, L_3^1, L_3^2, L_3^3$ also have corresponding values of the reactances $X_1^1, X_1^2, X_1^3, X_1^4, X_2^1, X_2^2, X_2^3, X_3^1, X_3^2, X_3^3$. A possible layout of the switchable reactances $X_1^1, X_1^2, X_1^3, X_1^4, X_2^1, X_2^2, X_2^3, X_3^1, X_3^2, X_3^3$ is shown in FIG. 3 using the example of a reactance X. The reactance component X consists of, for example, a module having a plurality of capacitors $C_P, C_S^1, C_S^2$ and a plurality of module switching elements $S_1, S_2, S_3$. Inductors may also be used instead of or in addition to capacitors. For the sake of simplicity, however, only capacitors are shown in FIG. 3. It is assumed in the following that the reactances are pure capacitors or condensers, but other reactances may be used.

As shown in FIG. 3, the module may include, for example, two capacitors $C_S^1, C_S^2$ connected in series and a capacitor $C_P$ connected in parallel therewith. The two series-connected capacitors $C_S^1, C_S^2$ may each be bypassed individually using one of the switches $S_1, S_2$ (e.g., which are connected in series, in parallel with the capacitors $C_S^1$, $C_S^2$, the connecting link between the switches $S_1$, $S_2$ being connected to the connection between the capacitors $C_S^1$, $C_S^2$). Opening the switches $S_1$, $S_2$ activates the associated capacitors $C_S^1$, $C_S^2$. When the switches $S_1$, $S_2$ are closed, the capacitors $C_S^1$, $C_S^2$ are each deactivated. A further switch $S_3$ is connected in series upstream of the parallel-connected capacitor $C_P$. The capacitor $C_P$ connected in parallel is activated when the further switch $S_3$ is closed and deactivated when the further switch $S_3$ is open. Depending on the circuit configuration of the module switching elements $S_1$, $S_2$, $S_3$, different capacitive values of the overall reactance component X may be activated.

This switchover capability is useful because the capacitor configuration of a specific antenna architecture may not match the capacitor configuration of a different antenna architecture. The capacitors may assume other values. This applies, for example, when completely different antenna architectures (e.g., such as a birdcage antenna and a remote body array RBA) are to be implemented. The module switching elements may also be embodied as RF-capable PIN diodes.

Given the switching configuration shown in FIG. 2, in which each of the switching elements $S_{12}^1$, $S_{12}^2$ is in the switch position A, and given appropriate setting of values of the reactance components $X_1^1$, $X_1^2$, $X_1^3$, $X_1^4$, $X_2^1$, $X_2^2$, $X_2^3$, $X_3^1$, $X_3^2$, $X_3^3$, the antenna arrangement is connected such that the antenna arrangement forms a birdcage antenna structure $A_1$. The capacitive values of the reactances amount to about 30 pF for an antenna that transmits at 120 MHz (e.g., in a 3 T magnetic field), for example, and to about 120 pF for an antenna that transmits at 60 MHz (e.g., in a 1.5 T magnetic field).

Figure 4:
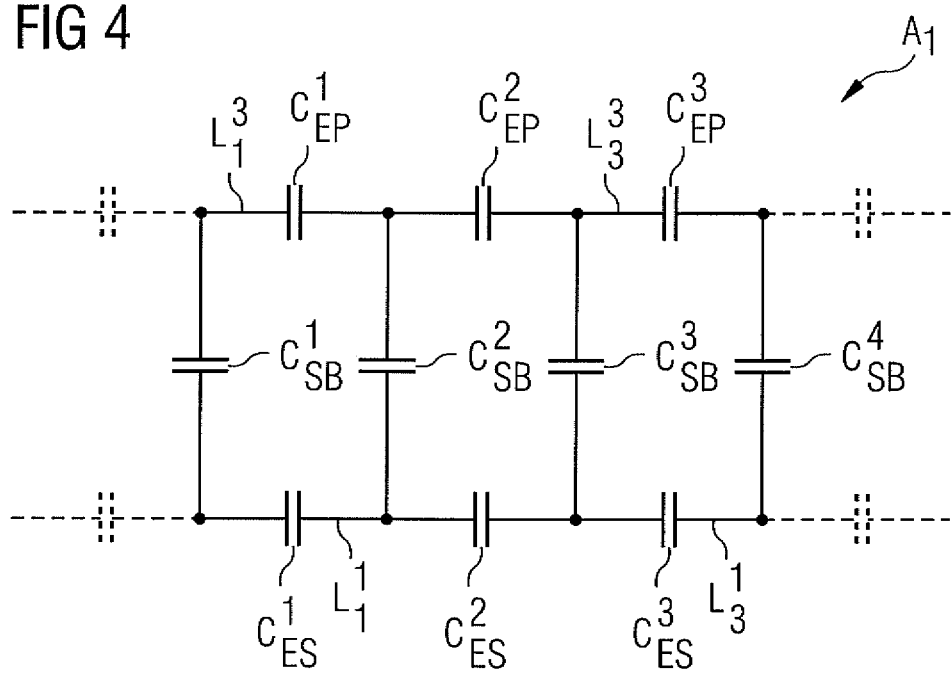
FIG. 4 shows a circuit diagram of one embodiment of the magnetic resonance antenna arrangement of FIG. 1 in a first switching configuration for forming a birdcage antenna.

An equivalent circuit diagram for such an antenna architecture is shown in FIG. 4. The reactances in each case are represented as capacitors. The birdcage has two end rings that are interconnected by a specific number of antenna rods. The antenna rods are each shown running vertically in FIG. 4 and the associated capacitors $C_{SB}^1$, $C_{SB}^2$, $C_{SB}^3$, $C_{SB}^4$ in the rods are each designated by the subscripted index SB. At the top in FIG. 4, the antenna rods are connected via an end ring (e.g., the end ring on the patient side, at which the patient is introduced into the measurement chamber), capacitors $C_{EP}^1$, $C_{EP}^2$, $C_{EP}^3$ each being located in the end ring between two rods. Capacitors $C_{ES}^1$, $C_{ES}^2$, $C_{ES}^3$ are disposed in individual segments of the end ring on the opposite service side (e.g., the bottom end ring in FIG. 4).

Both distances between the capacitors and values of the capacitors used may determine operating frequency and functionality of the birdcage antenna architecture $A_1$. The birdcage antenna architecture may include an arrangement of 8, 16 or 32 rods, for example. The entire antenna architecture may be connected at one of the end rings (e.g., the service-side end ring) to an electric feeder cable, via which defined radio-frequency signals coming from a radio-frequency amplifier are fed into the antenna arrangement. The connection of the electric feeder cables, which may be effected by way of capacitors, is well-known to the person skilled in the art, so a description may be dispensed with in this instance.

In the exemplary embodiment according to FIG. 2, if the switching elements $S_{12}^1$, $S_{12}^2$ are each switched over from the switching state A to the switching state B, and the reactance components $X_1^1$, $X_1^2$, $X_1^3$, $X_1^4$, $X_2^1$, $X_2^2$, $X_2^3$, $X_3^1$, $X_3^2$, $X_3^3$ are switched to suitable values, the entire antenna arrangement forms a second antenna architecture $A_2$ in the form of an antenna array or remote body array RBA.

Figure 5:
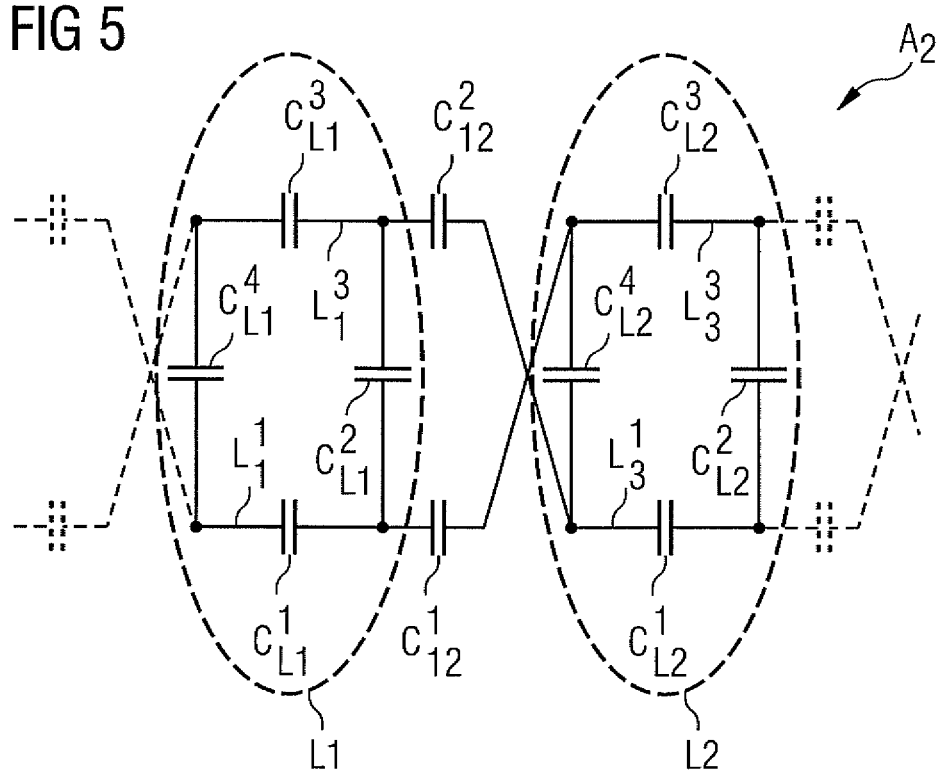
FIG. 5 shows a circuit diagram of one embodiment of the magnetic resonance antenna arrangement of FIG. 1 in a second switching configuration for forming an antenna array.

The functionality of the RBA antenna architecture $A_2$ is shown in FIG. 5 with the aid of an equivalent circuit diagram. It is assumed that the reactances are pure capacitors with other capacitance values. The corresponding capacitors have been labeled with different reference numerals from those in FIG. 4, even if the corresponding capacitors are implemented using the same switchable reactance components. The RBA includes a series of individual antenna conductor loops L1, L2 (e.g., loop antennas) that are connected to one another by decoupling elements. The diameter of the loop antennas L1, L2 ranges, for example, between 100 mm and 400 mm. For example, the loop antennas L1, L2 may be between 300 mm and 400 mm long and between 100 mm and 150 mm wide. In FIG. 5, the feeder cables for all of the elements are not represented in the drawing. In one embodiment, each loop antenna L1, L2 is connected to a separate feeder cable.

In the exemplary embodiment according to FIG. 2 or the equivalent circuit diagram shown in relation thereto in FIG. 5, one loop antenna L1 includes the individual antenna conductor tracks having the capacitors $C_{L1}^1$, $C_{L1}^2$, $C_{L1}^3$ and $C_{L1}^4$. Correspondingly, the second loop antenna L2 consists of the conductor track sections having the capacitors $C_{L2}^1$, $C_{L2}^2$, $C_{L2}^3$, $C_{L2}^4$.

Since the individual loop antennas L1, L2 may be operated separately, the individual loop antennas L1, L2 are decoupled from one another in order to prevent the signals of one loop antenna L1 interfering with the adjacent loop antenna L2 or vice versa. Adjacent loop antennas may be decoupled within an antenna array by overlapping the individual loop antennas in a border zone in order to achieve an inductive decoupling. In one embodiment, capacitive connections are established between adjacent loop antennas L1, L2. This is achieved in that top antenna element $L_1^3$ of left-hand loop antenna L1 in FIGS. 2 and 5 is connected crosswise to corresponding bottom antenna element $L_3^1$ of adjacent (e.g., right-hand) loop antenna L2 via a capacitor $C_{12}^2$ and conversely the top antenna element $L_3^3$ of the right-hand loop antenna L2 is connected to bottom antenna element $L_1^1$ of the left-hand loop antenna L1 via a capacitor $C_{12}^1$. This crossover connection is effected, as shown in FIG. 2, with the aid of the switching elements $S_{12}^1$, $S_{12}^2$ in the second switching state B and with the aid of additional conductor track sections $B_{12}^1$, $B_{12}^2$ that intersect at one point. The crossover is provided because of the phase angle of the decoupling voltage. A transformation or inductive coupling may also be realized instead of a crossover.

Because the individual antenna architectures are operated in alternation, the feed is also unproblematic. Each feeder cable is decouplable from the antenna arrangement either actively (e.g., via semiconductor switches such as PIN diodes) or passively using antiparallel diode pairs. Combinations of active or passive switches (e.g., self-powered PIN diode switches) may also be used.

Preamplifiers may be connected in or on the antenna arrangement (e.g., on the individual loops of the RBA). The preamplifiers may be disconnected from the antenna arrangement using corresponding switching elements when the preamplifiers are not required. If, for example, the antenna arrangement for transmitting is always used in the form of the birdcage antenna architecture $A_1$ and receiving always takes place using the RBA antenna architecture $A_2$, then a preamplifier may be connected into or onto each loop antenna L1, L2 of the RBA. In the transmit case, the preamplifier is disconnected using suitable switching elements from the birdcage antenna architecture that is then realized.

The above-described exemplary embodiment discloses a magnetic resonance antenna arrangement having a structure, in which two completely different antenna architectures $A_1$, $A_2$ (e.g., a birdcage antenna architecture $A_1$ and an RBA antenna architecture $A_2$) may be functionally implemented on the same surface on a supporting tube and using as many common components as possible. These structures are implemented in a very space-saving manner in the radial direction (e.g., toward the center of the patient tunnel), with the result that there remains a maximum amount of free space in the patient tunnel for the patient.

A very slim, thin antenna having a highly versatile geometry is realized. The interconnection problem occurring in the case of a separate layout of a birdcage with an RBA disposed inside the birdcage (e.g., on the internal wall of the patient tunnel; the birdcage antenna structure having an effect on the RBA and vice versa) may be optimally solved with little additional overhead using the integrated method of construction within a single antenna arrangement.

The birdcage antenna architecture $A_1$ may be used as a bodycoil for transmitting and the RBA antenna architecture $A_2$ for receiving the resonance signals. Other possibilities for transmitting and receiving may also be used. For example, it is possible to both transmit and receive using the bodycoil. The RBA function is permanently deactivated. Alternatively, the bodycoil may be used for transmitting and a further separate, conventional local coil for receiving. In one embodiment of a magnetic resonance device, only local coils may be used to transmit and receive and to detune and deactivate one embodiment of the antenna arrangement permanently during this operation (e.g., neither the RBA functionality nor the birdcage functionality is used). The birdcage functionality may be deactivated completely for a measurement and to both transmit and receive using the RBA (e.g., in order to be able to both transmit and receive in parallel via the individual loop antennas in the parallel imaging method).

When the birdcage is used as a transmit antenna and the RBA as a receive antenna, the reactances and any connected preamplifiers are advantageously embodied such that at least in the birdcage functionality, the antenna arrangement is implemented as a power coil. In the circuit configuration as an RBA, all the components used exclusively for the RBA are embodied, not for delivering high power, but for providing more sensitive reception (e.g., have more finely built structures).

The structure physically depicted in the figures is merely an exemplary embodiment, and the basic principle of the antenna arrangement embodied according to the present embodiments may also be varied without leaving the scope of the invention, insofar as this is specified by the claims. The use of the indefinite article "a" or "an" does not rule out the possibility that the features in question may also be present more than once.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance antenna arrangement comprising:
   a plurality of antenna elements disposed around and outside of a measurement chamber at least partially defined by at least one surface of a magnetic resonance device; and
   a plurality of switching elements,
   wherein the plurality of antenna elements and the plurality of switching elements are disposed and interconnected such that in a first switching configuration of the plurality of switching elements, the plurality of antenna elements form a first antenna architecture, and in a second switching configuration of the plurality of switching elements, the plurality of antenna elements form a second antenna architecture,
   wherein the first antenna architecture includes a birdcage antenna, and the second antenna architecture includes an antenna array having a plurality of antenna conductor loops, and
   wherein an antenna element of the plurality of antenna elements at least partially forms the birdcage antenna in the first switching configuration, and at least partially forms the antenna array in the second switching configuration, such that the antenna element at least partially forms the birdcage antenna or the antenna array based on switching configuration.

2. The antenna arrangement as claimed in claim 1, wherein an antenna element of the plurality of antenna elements has a reactance component having an adjustable value.

3. The antenna arrangement as claimed in claim 2, wherein the reactance component includes a module consisting of capacitive components, inductive components, or the capacitive components and the inductive components, and a module switching element.

4. The antenna arrangement as claimed in claim 3, wherein the plurality of switching elements, the module switching element, or the plurality of switching elements and the module switching element include semiconductor switching elements.

5. The antenna arrangement as claimed in claim 4, wherein the reactance component includes different capacitive components, inductive components, or capacitive and inductive components for the first antenna architecture and the second antenna architecture, the different capacitive components, inductive components, or capacitive components and inductive components being dimensioned for different radio-frequency power levels.

6. The antenna arrangement as claimed in claim 3, further comprising a control device that is connected to the plurality of switching elements, the module switching element, or the plurality of switching elements and the module switching element in order to switch the plurality of switching elements, the module switching element, or the plurality of switching elements and the module switching element between the first switching configuration and the second switching configuration.

7. The antenna arrangement as claimed in claim 6, wherein the reactance component includes different capacitive components, inductive components, or capacitive and inductive components for the first antenna architecture and the second antenna architecture, the different capacitive components, inductive components, or capacitive components and inductive components being dimensioned for different radio-frequency power levels.

8. The antenna arrangement as claimed in claim 3, wherein the reactance component includes different capacitive components, inductive components, or capacitive and inductive components for the first antenna architecture and the second antenna architecture, the different capacitive components, inductive components, or capacitive components and inductive components being dimensioned for different radio-frequency power levels.

9. The antenna arrangement as claimed in claim 2, wherein the reactance component includes different capacitive components, inductive components, or capacitive and inductive components for the first antenna architecture and the second antenna architecture, the different capacitive components, inductive components, or capacitive components and inductive components being dimensioned for different radio-frequency power levels.

10. The antenna arrangement as claimed in claim 1, wherein an antenna element of the plurality of antenna elements has a reactance component having an adjustable value.

11. The antenna arrangement as claimed in claim 1, wherein an antenna element of the plurality of antenna elements has a reactance component having an adjustable value.

12. A magnetic resonance device comprising:
a housing through which a measurement chamber extends; and
an antenna arrangement comprising:
a plurality of antenna elements disposed around and outside of the measurement chamber; and
a plurality of switching elements,
wherein the plurality of antenna elements and the plurality of switching elements are disposed and interconnected such that in a first switching configuration of the plurality of switching elements, the plurality of antenna elements form a first antenna architecture, and in a second switching configuration of the plurality of switching elements, the plurality of antenna elements form a second antenna architecture,
wherein the first antenna architecture includes a birdcage antenna, and the second antenna architecture includes an antenna array having a plurality of antenna conductor loops, and
wherein an antenna element of the plurality of antenna elements at least partially forms the birdcage antenna in the first switching configuration, and at least partially forms the antenna array in the second switching configuration, such that the antenna element at least partially forms the birdcage antenna or the antenna array based on switching configuration.

13. A method for acquiring magnetic resonance signals using a magnetic resonance device, the method comprising:
disposing a magnetic resonance antenna arrangement having a plurality of antenna elements around and outside of a measurement chamber of the magnetic resonance device and having a plurality of switching elements;
interconnecting the plurality of antenna elements for the purpose of transmitting magnetic resonance excitation signals using the plurality of switching elements such that the plurality of antenna elements form a first antenna architecture;
transmitting the magnetic resonance excitation signals via the first antenna architecture;
interconnecting the plurality of antenna elements for the purpose of receiving the magnetic resonance signals using the plurality of switching elements such that the plurality of antenna elements form a second antenna architecture; and
receiving the magnetic resonance signals via the second antenna architecture,
wherein the first antenna architecture includes a birdcage antenna, and the second antenna architecture includes an antenna array having a plurality of antenna conductor loops, and
wherein an antenna element of the plurality of antenna elements at least partially forms the birdcage antenna in the first switching configuration, and at least partially forms the antenna array in the second switching configuration, such that the antenna element at least partially forms the birdcage antenna or the antenna array based on switching configuration.

14. A magnetic resonance antenna arrangement comprising:
a plurality of antenna elements disposed around and outside of a measurement chamber of a magnetic resonance device, at least one antenna element of the plurality of antenna elements being a body coil antenna element; and
a plurality of switching elements,
wherein the plurality of antenna elements and the plurality of switching elements are disposed and interconnected such that in a first switching configuration of the plurality of switching elements, the plurality of antenna elements form a first antenna architecture, and in a second switching configuration of the plurality of switching elements, the plurality of antenna elements form a second antenna architecture,
wherein the first antenna architecture includes a birdcage antenna, and the second antenna architecture includes an antenna array having a plurality of antenna conductor loops, and
wherein an antenna element of the plurality of antenna elements at least partially forms the birdcage antenna in the first switching configuration, and at least partially forms the antenna array in the second switching configuration, such that the antenna element at least partially forms the birdcage antenna or the antenna array based on switching configuration.

* * * * *